(12) United States Patent
Chung et al.

(10) Patent No.: US 10,291,122 B2
(45) Date of Patent: May 14, 2019

(54) INPUT VOLTAGE DETECTION CIRCUIT AND POWER SUPPLY INCLUDING THE SAME

(71) Applicant: FAIRCHILD KOREA SEMICONDUCTOR LTD., Bucheon-si (KR)

(72) Inventors: Bonggeun Chung, Incheon (KR); SangCheol Moon, Daejeon (KR); Chenghao Jin, Bucheon-si (KR); Gwanbon Koo, Bucheon-si (KR)

(73) Assignee: SEMICONDUCTOR COMPONENTS INDUSTRIES, LLC, Pheonix, AZ (US)

( * ) Notice: Subject to any disclaimer, the term of this patent is extended or adjusted under 35 U.S.C. 154(b) by 34 days.

(21) Appl. No.: 15/196,348

(22) Filed: Jun. 29, 2016

(65) Prior Publication Data
US 2016/0380552 A1    Dec. 29, 2016

Related U.S. Application Data

(60) Provisional application No. 62/185,834, filed on Jun. 29, 2015.

(51) Int. Cl.
*H02M 3/156*    (2006.01)
*H02M 3/158*    (2006.01)
(Continued)

(52) U.S. Cl.
CPC ............ *H02M 3/158* (2013.01); *G01R 19/04* (2013.01); *H02M 1/36* (2013.01); *H02M 1/44* (2013.01);
(Continued)

(58) Field of Classification Search
CPC ......... G05F 5/00; G01R 15/12; G01R 15/144; G01R 19/00; G01R 19/30; G01R 21/06; G01R 31/261; G01R 31/2623; H02M 3/33538; H02M 3/33546; H02M 3/33515; H02M 3/33576; H02M 3/33553;
(Continued)

(56) References Cited

U.S. PATENT DOCUMENTS 4,626,746 A  * 12/1986  Zaderej .............. H05B 41/392
                                                    315/194
4,642,616 A  *  2/1987  Goodwin ............ G01R 19/145
                                                    307/413

(Continued)

*Primary Examiner* — Bryan R Perez
(74) *Attorney, Agent, or Firm* — AMPACC Law Group, PLLC

(57) ABSTRACT

Provided are an input voltage detection circuit and a power supply including the same. The power supply includes a rectifier circuit configured to generate a line input voltage by rectifying an alternating current (AC) input. The input voltage detection circuit which is applied to the power supply generates a peak sensing voltage that indicates a predetermined peak area defined around a peak of the line input voltage, generates a peak detection signal that indicates the peak of the line input voltage based on a center of the peak sensing voltage, and generates an input sensing voltage corresponding to the line input voltage by being synchronized with the peak detection signal. The power supply may control a switching period according to the input sensing voltage.

19 Claims, 8 Drawing Sheets

(51) Int. Cl.
*G01R 19/04* (2006.01)
*H02M 1/36* (2007.01)
*H02M 1/44* (2007.01)
*H02M 7/04* (2006.01)
*H02M 1/00* (2006.01)
*H02M 7/217* (2006.01)

(52) U.S. Cl.
CPC ............. *H02M 3/156* (2013.01); *H02M 7/04* (2013.01); *H02M 7/217* (2013.01); *H02M 2001/0009* (2013.01); *H02M 2001/0048* (2013.01); *H02M 2001/0054* (2013.01); *H02M 2001/0058* (2013.01); *Y02B 70/1491* (2013.01)

(58) Field of Classification Search
CPC ......... H02M 3/33507; H02M 3/33592; H02M 3/33523; H02M 3/3353; H02M 3/33569; H02M 2001/0058; H02M 2001/0009; H02M 2001/0048; H02M 2001/0054; H02M 7/217; H02M 7/04; H02M 1/36; H02M 1/44; Y02B 70/1491
USPC .......................................................... 323/299
See application file for complete search history.

(56) References Cited

U.S. PATENT DOCUMENTS

| | | | |
|---|---|---|---|
| 7,271,579 | B2 | 9/2007 | Shimada et al. |
| 2005/0151524 | A1* | 7/2005 | Sae-Ueng ............... H02M 3/28 323/282 |
| 2005/0151567 | A1* | 7/2005 | Shimada ........... G01R 19/16538 327/78 |
| 2010/0091420 | A1* | 4/2010 | Tsai ..................... H02H 7/1213 361/90 |
| 2010/0321000 | A1 | 12/2010 | Lee et al. |
| 2013/0119960 | A1* | 5/2013 | Zilberberg ............ H02M 5/293 323/299 |

* cited by examiner

INPUT VOLTAGE DETECTION CIRCUIT AND POWER SUPPLY INCLUDING THE SAME

CROSS-REFERENCE TO RELATED APPLICATIONS

This application claims priority from U.S. Provisional Application No. 62/185,834, filed on Jun. 29, 2015 with the United States Patent and Trademark Office, the entire contents of which are incorporated herein by reference.

BACKGROUND (a) Technical Field

Embodiments of the present invention relate to an input voltage detection circuit and a power supply including the same. For example, the embodiments relate to a circuit for detecting a zero-crossing or peak of a line input voltage.

(b) Description of the Related Art

A power supply converts an alternating current (AC) input into a line input voltage by rectifying the AC input.

A rectifier circuit of the power supply includes a plurality of diodes and parasitic capacitors are respectively connected to the plurality of diodes in parallel. Also, a Y-capacitor for flowing electromagnetic interference (EMI) noise to a ground is connected between an input terminal of the AC input and the rectifier circuit.

However, distortion of the line input voltage is caused by tolerances of the parasitic capacitor and the Y-capacitor. For example, as the tolerances of the parasitic capacitor and the Y-capacitor are increased, the distortion of the line input voltage is increased.

Thus, there is a problem in that it is difficult to accurately detect a zero-crossing of the line input voltage.

Also, when the power supply has no load or a light load, distortion of the line input voltage may occur in the vicinity of the zero-crossing of the line input voltage. In this case, it is also difficult to detect the zero-crossing of the line input voltage.

SUMMARY

The present invention is directed to an input voltage detection circuit capable of accurately detecting a zero-crossing of a line input voltage and a power supply including the same.

According to an aspect of the present invention, there is provided an input voltage detection circuit including a peak area sensor configured to generate a peak sensing voltage that indicates a predetermined peak area defined around a peak of a line input voltage and a peak detector configured to generate a peak detection signal that indicates the peak of the line input voltage based on a center of the peak sensing voltage. The input voltage detection circuit may generate an input sensing voltage corresponding to the line input voltage by being synchronized with the peak detection signal.

The input voltage detection circuit may include a detection signal generator configured to generate a first detection signal that varies by being synchronized with the peak detection signal and a second detection signal, that has a phase difference corresponding to one cycle of the peak detection signal and that varies by being synchronized with the peak detection signal, and a synthesizer configured to synthesize the first and second detection signals and generate the input sensing voltage.

The detection signal generator may include a T flip-flop configured to invert a first output signal by being synchronized with the peak detection signal and invert a second output signal having an inverted phase with respect to a phase of the first output signal by being synchronized with the peak detection signal. The detection signal generator may generate a first detection signal which is increased or decreased according to the first output signal and a second detection signal which is increased or decreased according to the second output signal.

The detection signal generator may further include a capacitor connected between a first node and a ground, a first current source connected to the first node and configured to supply a current to the capacitor, a second current source connected to the first node, and a switch connected between the second current source and the ground. A current generated by the second current source may be twice a current generated by the first current source.

The switch may switch according to the first output signal and a voltage of the first node may be the first detection signal.

The switch may switch according to the second output signal, and the voltage of the first node may be the second detection signal.

The synthesizer may include a first diode including an anode to which the first detection signal is input and a cathode connected to an output node, and a second diode including an anode to which the second detection signal is input and a cathode connected to the output node. A voltage of the output node may be the input sensing voltage.

The input voltage detection circuit may further include a detection signal generator configured to generate a sawtooth wave, which is increased during one cycle of the peak detection signal by being synchronized with the peak detection signal, a zero-crossing detector configured to detect a center of the sawtooth wave and generate a zero-crossing detection signal that indicates a zero-crossing time, and a sensing signal generator configured to generate an input sensing voltage, which is decreased by being synchronized with the peak detection signal and is increased by being synchronized with the zero-crossing detection signal.

The detection signal generator may include a current source configured to supply a current, a capacitor connected between a first node and a ground, a first switch connected between the capacitor and the current source and configured to switch according to an inverted peak detection signal, and a second switch connected between the first node and the ground and configured to switch according to the peak detection signal. The voltage of the first node may be the sawtooth wave.

The zero-crossing detector may generate a reference voltage corresponding to the center of the sawtooth wave and generate the zero-crossing detection signal based on a result of comparing the sawtooth wave and the reference voltage.

The zero-crossing detector may include a sample-and-hold unit configured to sample and hold a peak of the sawtooth wave, two resistors connected in series between an output of the sample-and-hold unit and a ground, and a comparator configured to compare the sawtooth wave with the reference voltage. The zero-crossing detector may generate the zero-crossing detection signal based on an output of the comparator.

The zero-crossing detector may further include an inverter configured to invert and output the output of the comparator, and a logic gate configured to calculate a logical conjunction of the output of the comparator and an output of the inverter and generate the zero-crossing detection signal.

The sensing signal generator may include an SR flip-flop configured to enable a third output signal by being synchronized with the zero-crossing detection signal and enable a fourth output signal by being synchronized with the peak detection signal. The sensing signal generator may generate the input sensing voltage, which is increased according to the third output signal and is decreased according to the fourth output signal.

The sensing signal generator may include a first current source configured to supply a first current, a second current source configured to sink a second current, a capacitor connected between an output node and a ground, a first switch connected between the output node and the first current source and configured to switch according to the third output signal, and a second switch connected between the output node and the second current source and configured to switch according to the fourth output signal.

The peak area sensor may generate a first reference voltage which determines a peak area based on a peak of an input detection voltage corresponding to the line input voltage, and generate the peak sensing voltage based on a result of comparing the input detection voltage and the first reference voltage.

The peak area sensor may include a sample-and-hold unit configured to sample the peak of the input detection voltage, lower and hold the sampled peak, and generate the first reference voltage, a comparator configured to compare the input detection voltage and the first reference voltage, a first switch configured to switch according to an output of the comparator, a capacitor connected between a first terminal of the switch and a ground, a current source connected to a second terminal of the switch, and a second switch connected to the capacitor in parallel and configured to switch according to an inverted output of the comparator. A voltage of the capacitor may be the peak sensing voltage.

The peak detector may set a second reference voltage corresponding to the center of the peak sensing voltage and generate the peak detection signal based on a result of comparing the peak sensing voltage and the second reference voltage.

The peak detector may include a diode including an anode to which the peak sensing voltage is applied and a cathode connected to a first node, a capacitor connected between the first node and a ground, a first resistor and a second resistor connected in series between the first node and the ground, and a comparator configured to compare the peak sensing voltage and a node voltage between the first and second resistors and generate the peak detection signal. The node voltage between the first resistor and the second resistor may be the second reference voltage.

The peak detector may include a sample-and-hold unit configured to sample and hold a peak of the peak sensing voltage, a first resistor and a second resistor connected in series between an output of the sample-and-hold unit and a ground, a comparator configured to compare the peak sensing voltage and a node voltage between the first resistor and the second resistor, an inverter configured to invert an output of the comparator, and a logic gate configured to calculate a logical conjunction of the output of the comparator and an output of the inverter and generate the peak detection signal. The node voltage between the first and second resistors may be the second reference voltage.

The input voltage detection circuit may detect a zero-crossing time based on two adjacent peaks of the line input voltage.

According to another aspect of the present invention, there is provided a power supply including a rectifier circuit configured to generate a line input voltage by rectifying an alternating current (AC) input, an input voltage detection circuit configured to generate a peak sensing voltage that indicates a predetermined peak area defined around a peak of the line input voltage, generate a peak detection signal that indicates the peak of the line input voltage based on a center of the peak sensing voltage, and generate an input sensing voltage corresponding to the line input voltage by being synchronized with the peak detection signal, and a power converter configured to control a switching period according to the input sensing voltage.

The present invention provides an input voltage detection circuit capable of accurately detecting a zero-crossing of a line input voltage and generating an arbitrary waveform having the same phase as the input voltage circuit, and a power supply including the same.

DETAILED DESCRIPTION OF THE EMBODIMENTS

Figure 1:
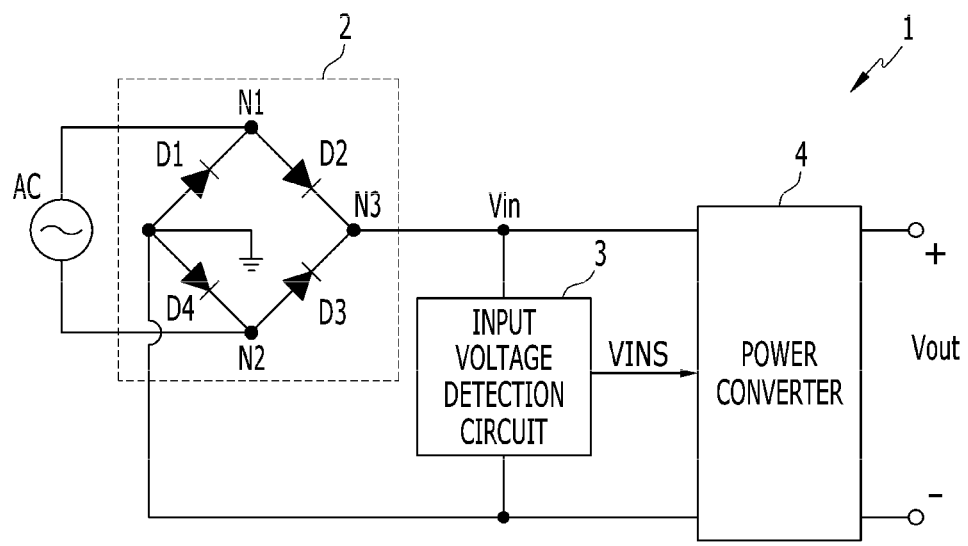
FIG. 1 is a diagram illustrating a power supply according to an embodiment of the present invention.

Hereinafter, embodiments that are easily performed by those skilled in the art will be described in detail with reference to the accompanying drawings. However, embodiments of the present invention may be implemented in several different forms, and are not limited to the embodiments described herein. In addition, parts irrelevant to the description are omitted in the drawings in order to clearly explain embodiments of the present invention. Similar parts are denoted by similar reference numerals throughout this specification.

Throughout this specification, when a part is referred to as being "connected" to another part, the part may be "directly connected" or "electrically connected" via an intervening part. Also, when a certain part "includes" a certain component, this does not exclude other components from being included unless described otherwise, and other components may in fact be included.

FIG. 1 is a diagram illustrating a power supply according to an embodiment of the present invention.

As illustrated in FIG. 1, a power supply 1 includes a rectifier circuit 2, an input voltage detection circuit 3, and a power converter 4.

The rectifier circuit 2 according to the embodiment is implemented as a bridge diode, but the present invention is not limited thereto. The rectifier circuit 2 includes four diodes D1 to D4. Anodes of the diode D1 and the diode D4 are connected to a ground, a cathode of the diode D1 and an anode of the diode D2 are connected to a node N1, a cathode of the diode D4 and an anode of the diode D3 are connected to a node N2, and a cathode of the diode D2 and a cathode of the diode D3 are connected to a node N3. An alternating current (AC) input AC is supplied between the node N1 and the node N2.

The input voltage detection circuit 3 detects a peak of a line input voltage Vin, generates at least one detection signal synchronized with a phase of the line input voltage Vin based on the detected peak, and generates an input sensing voltage VINS based on the line input voltage Vin using at least one detection signal.

The power converter 4 converts the line input voltage Vin into an output voltage Vout. The power converter 4 may include a switching element (not illustrated), and may control the output voltage Vout by controlling switching of the switching element.

The power converter 4 may control a switching period according to the input sensing voltage VINS. For example, under a light load condition, the power converter 4 switches the switching element only during a predetermined period of one cycle of the input sensing voltage VINS. The predetermined period may be determined around a zero-crossing time of the input sensing voltage VINS according to the load. In this case, the switching does not occur in a predetermined period including a peak of the line input voltage Vin, and thus a switching loss may be reduced. When the switching is made in the entire period of the input voltage, the switching loss generated in proportion to the input voltage is increased.

Figure 2:
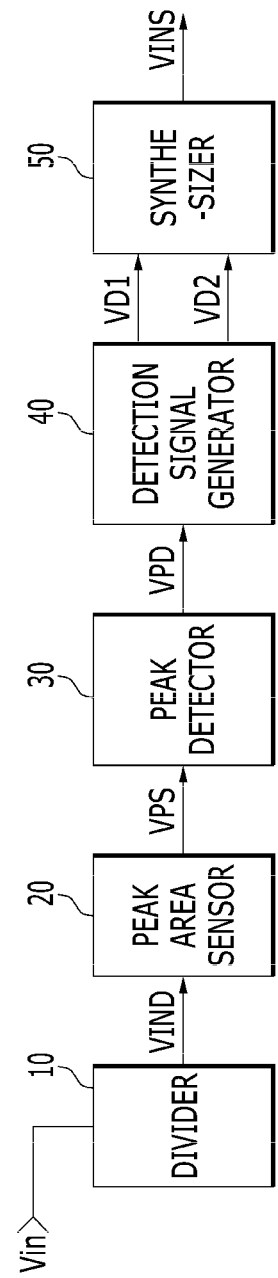
FIG. 2 is a diagram illustrating an input voltage detection circuit according to the embodiment.

FIG. 2 is a diagram illustrating the input voltage detection circuit according to the embodiment.

As illustrated in FIG. 2, the input voltage detection circuit 3 includes a divider 10, a peak area sensor 20, a peak detector 30, a detection signal generator 40, and a synthesizer 50.

The divider 10 generates an input detection voltage VIND by resistor-dividing the line input voltage Vin.

The peak area sensor 20 may generate a peak sensing voltage VPS which indicates a predetermined peak area defined around a peak of the line input voltage Vin. The peak area sensor 20 sets a reference voltage VR1 based on a peak of the input detection voltage VIND and generates the peak sensing voltage VPS based on a result of comparing the input detection voltage VIND and the reference voltage VR1. A peak area may be determined according to the reference voltage VR1.

The peak detector 30 may detect a center of the peak sensing voltage VPS as a peak point of the line input voltage Vin. The peak detector 30 sets a reference voltage VR2 corresponding to the center of the peak sensing voltage VPS and generates a peak detection signal VPD corresponding to the peak of the line input voltage Vin based on a result of comparing the peak sensing voltage VPS and the reference voltage VR2.

The detection signal generator 40 generates a first detection signal VD1 which varies by being synchronized with the peak detection signal VPD and generates a second detection signal VD2 which has a phase difference corresponding to one cycle of the peak detection signal VPD and varies by being synchronized with the peak detection signal VPD.

The synthesizer 50 synthesizes the first and second detection signals VD1 and VD2 to generate the input sensing voltage VINS. For example, the synthesizer 50 may generate the input sensing voltage VINS based on a higher voltage of the first detection signal VD1 and the second detection signal VD2.

Figure 3:
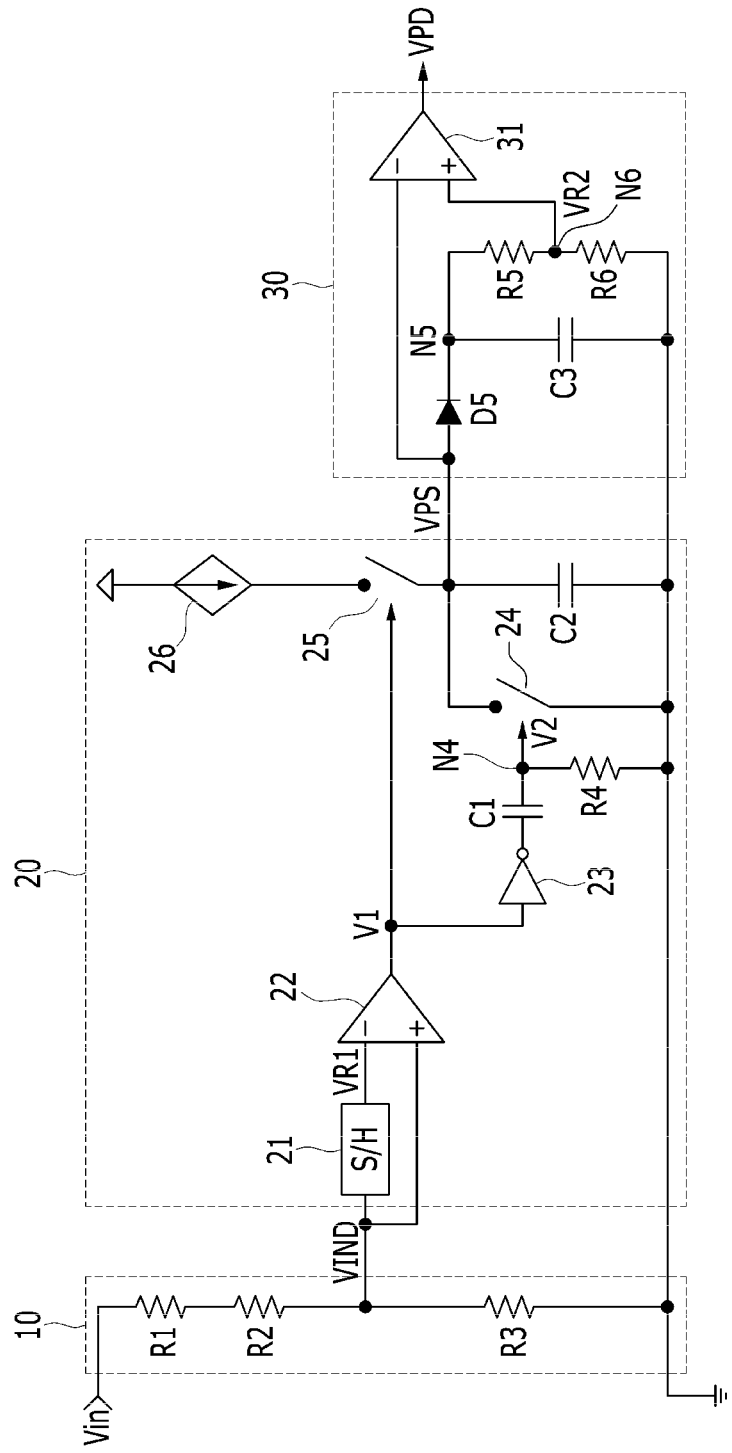
FIG. 3 is a diagram illustrating a configuration of a divider, a peak area sensor, and a peak detector according to the embodiment.

FIG. 3 is a diagram illustrating a configuration of the divider, the peak area sensor, and the peak detector according to the embodiment.

The divider 10 includes three resistors R1 to R3. The resistor R1, the resistor R2, and the resistor R3 are connected in series between the line input voltage Vin and the ground. The input detection voltage VIND is a voltage of a node to which the resistor R2 and the resistor R3 are connected.

The peak area sensor 20 includes a sample-and-hold unit 21, a comparator 22, an inverter 23, two switches 24 and 25, a current source 26, a resistor R4, and two capacitors C1 and C2.

The sample-and-hold unit 21 samples a peak of the input detection voltage VIND, lowers and holds the sampled peak by a predetermined rate or a predetermined voltage, and generates the reference voltage VR1. The reference voltage VR1 is generated as a voltage which is low and close to the peak of the input detection voltage VIND. An enable period of the peak detection signal VPD may be adjusted according to the predetermined rate or the predetermined voltage.

The comparator 22 outputs a voltage V1 based on a result of comparing the input detection voltage VIND and the reference voltage VR1. For example, the input detection voltage VIND is input to a non-inverting terminal (+) of the comparator 22 and the reference voltage VR1 is input to an inverting terminal (−) of the comparator 22. When an input of the non-inverting terminal (+) is greater than or equal to an input of the inverting terminal (−), the comparator 22 outputs the voltage V1 having a high level, and otherwise the comparator 22 outputs the voltage V1 having a low level.

The inverter 23 inverts and outputs the voltage V1. The capacitor C1 and the resistor R4 filter an output of the inverter 23. In FIG. 3, the capacitor C1 and the resistor R4 are connected in series between an output terminal of the inverter 23 and the ground and perform high-pass filtering on the output of the inverter 23.

A voltage V2 of a node N4 to which the capacitor C1 and the resistor R4 are connected may have a waveform having a rising edge when the output of the inverter 23 is increased and a waveform having a falling edge when the output of the inverter 23 is decreased.

The switch 25 is connected between the current source 26 and one electrode of the capacitor C2, and switches according to the voltage V1. The switch 24 is connected to the capacitor C2 in parallel and switches according to the voltage V2 of the node N4.

For example, the switch 25 is turned on by the voltage V1 having a high level and is turned off by the voltage V1 having a low level. The switch 24 is turned on at a rising edge of the voltage V2. The voltage V2 is decreased after a rising edge time, and the switch 24 is maintained in a turned-on state during a short period synchronized with the rising edge.

During an on-period of the switch 25, the capacitor C2 is charged by a current of the current source 26 and the peak sensing voltage VPS is increased. The capacitor C2 is discharged by turning-on the switch 24, and the peak sensing voltage VPS is reset to a ground level.

The peak detector 30 includes a comparator 31, a diode D5, a capacitor C3, and two resistors R5 and R6.

The comparator 31 outputs the peak detection signal VPD based on a result of comparing the peak sensing voltage VPS and the reference voltage VR2. For example, the peak sensing voltage VPS is input to a non-inverting terminal (+) of the comparator 31 and the reference voltage VR2 is input to an inverting terminal (−) of the comparator 31. When an input of the non-inverting terminal (+) is greater than or equal to an input of the inverting terminal (−), the comparator 31 outputs the peak detection signal VPD having a high level, and otherwise the comparator 31 outputs the peak detection signal VPD having a low level.

An anode of the diode D5 is connected to an electrode of the capacitor C2, and a cathode of the diode D5 is connected to a node N5. The capacitor C3 is connected between the node N5 and the ground, and the resistor R5 and the resistor R6 are connected in series between the node N5 and the ground. When the peak sensing voltage VPS is charged into the capacitor C3 through the diode D5, a voltage of the capacitor C3 is divided by the resistor R5 and the resistor R6.

Since the diode D5 is conductive when the peak sensing voltage VPS is increased to be higher than a voltage of the node N5, a voltage charged into the capacitor C3 follows a peak of the peak sensing voltage VPS. For example, the voltage of the node N5 may have the same level as a peak in each cycle of the peak sensing voltage VPS. The voltage of the node N5 becomes the reference voltage VR2 by being divided by the resistor R5 and the resistor R6. When the resistor R5 and the resistor R6 are the same resistor, the reference voltage VR2 is half of the peak of the peak sensing voltage VPS.

Figure 4:
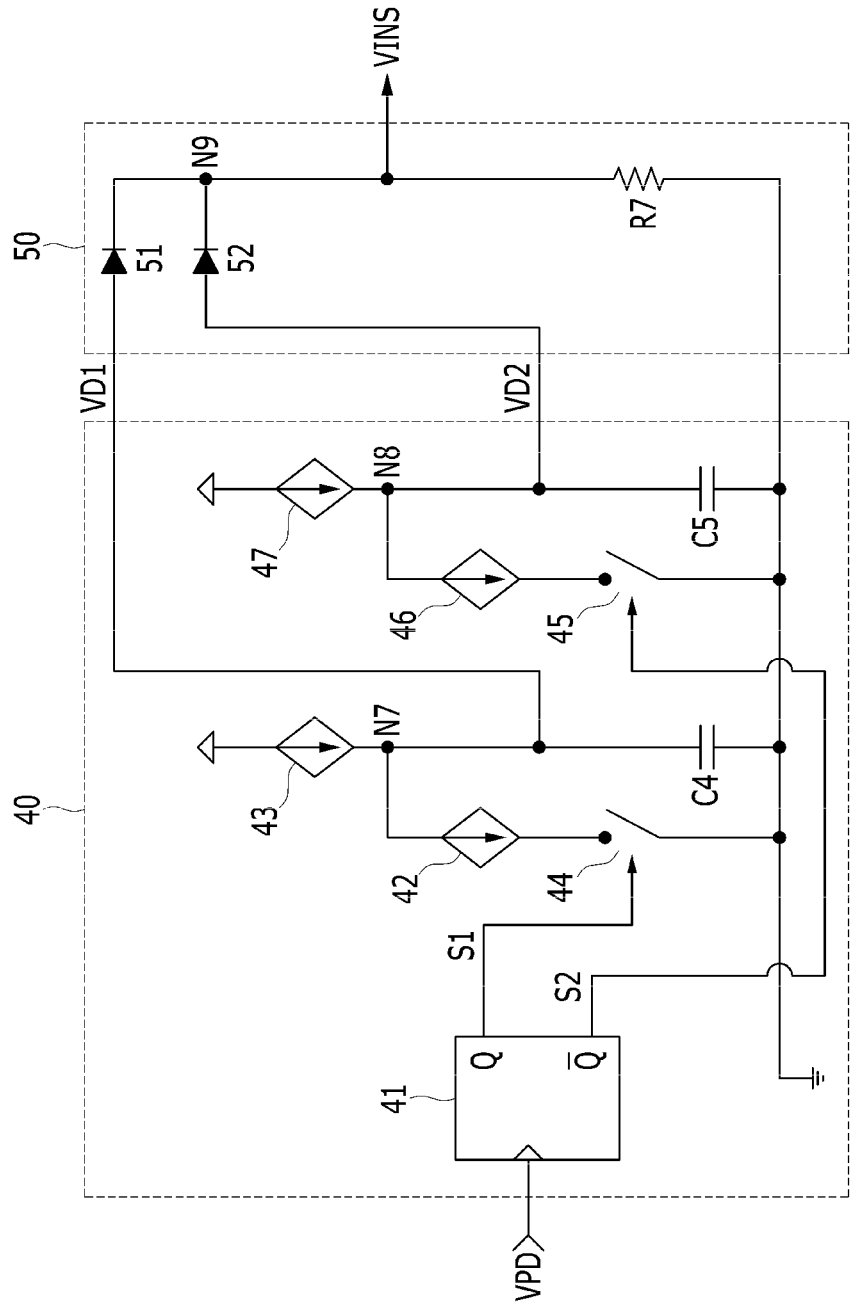
FIG. 4 is a diagram illustrating a configuration of a detection signal generator and a synthesizer according to the embodiment.

FIG. 4 is a diagram illustrating a configuration of the detection signal generator and the synthesizer according to the embodiment.

The detection signal generator 40 includes a T flip-flop 41, four current sources 42, 43, 46, and 47, two switches 44 and 45, and two capacitors C4 and C5.

The T flip-flop 41 inverts an output signal S1 by being synchronized with the peak detection signal VPD and inverts an output signal S2 having an inverted phase with respect to a phase of the output signal S1 by being synchronized with the peak detection signal VPD. For example, the T flip-flop 41 may invert each of the output signal S1 and the output signal S2 at a rising edge time of the peak detection signal VPD.

The capacitor C4 is connected between a node N7 and the ground, and the current source 43 is connected to the node N7 to supply a current to the capacitor C4. The current source 42 is connected to the node N7 and may sink a current to the ground through the switch 44. The switch 44 is connected between the current source 42 and the ground, and the capacitor C4 is discharged by the current of the current source 42 when the switch 44 is turned on. The current of the current source 42 may be twice the current of the current source 43.

The capacitor C5 is connected between a node N8 and the ground, and the current source 47 is connected to the node N8 to supply a current to the capacitor C5. The current source 46 is connected to the node N8 and may sink a current to the ground through the switch 45. The switch 45 is connected between the current source 46 and the ground, and the capacitor C5 is discharged by the current of the current source 46 when the switch 45 is turned on. The current of the current source 46 may be twice the current of the current source 47.

A voltage of the node N7 becomes the first detection signal VD1 and a voltage of the node N8 becomes the second detection signal VD2.

The synthesizer 50 includes two diodes 51 and 52 and one resistor R7. An anode of the diode 51 is connected to the node N7, and a cathode of the diode 51 is connected to a node N9. An anode of the diode 52 is connected to the node N8, and a cathode of the diode 52 is connected to the node N9. The resistor R7 is connected between the node N9 and the ground.

When a voltage of the first detection signal VD1 is higher than a voltage of the node N9, the diode 51 is conductive and the voltage of the node N9 follows the first detection signal VD1. When a voltage of the second detection signal VD2 is higher than the voltage of the node N9, the diode 52 is conductive and the voltage of the node N9 follows the second detection signal VD2. Then, the diode 51 or 52 corresponding to the signal of the first detection signal VD1 or the second detection signal VD2, which is higher than the voltage of the node N9, is conductive, and the voltage of the node N9 follows a voltage transferred through the conductive diode. The input sensing voltage VINS follows the voltage of the node N9.

The resistor R7 may be designed as a very large resistor so that a current does not almost flow to the ground.

Figure 5:
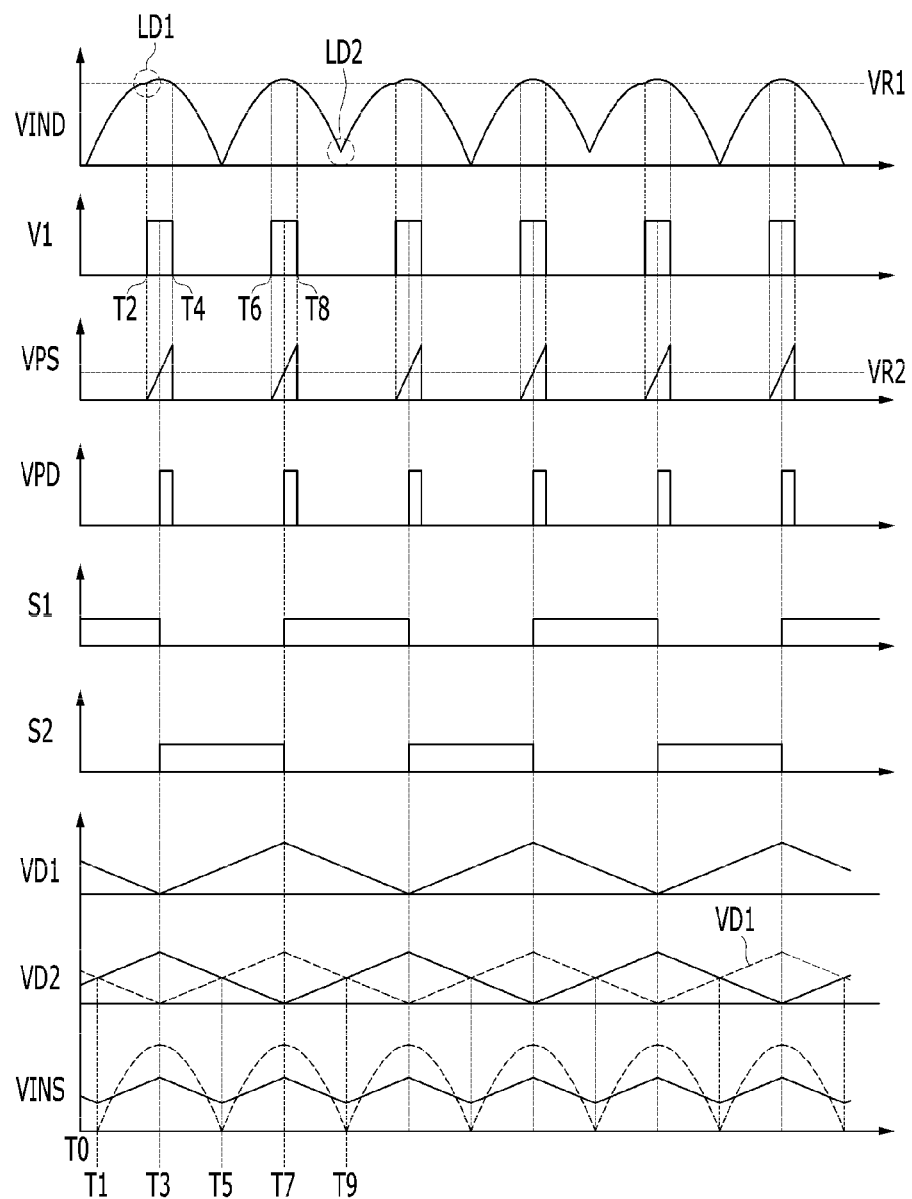
FIG. 5 is a waveform diagram for describing an operation of the input voltage detection circuit according to the embodiment.

FIG. 5 is a waveform diagram for describing an operation of the input voltage detection circuit according to the embodiment.

The reference voltage VR2 illustrated in FIG. 5 is half of a peak of the peak sensing voltage VPS.

As illustrated in FIG. 5, for convenience of description, it is assumed that distortions such as an area LD1 and an area LD2 are present in the input detection voltage VIND. For example, there is distortion at a peak of the line input voltage Vin in the area LD1, and since the line input voltage Vin is decreased to only a voltage higher than zero voltage and is increased again in the area LD2, a zero-crossing does not occur.

The input detection voltage VIND starts to increase from zero voltage at a time T0, and the time T0 may be a zero-crossing time due to distortion.

The second detection signal VD2 crosses the first detection signal VD1 at a time T1, and the second detection signal VD2 is higher than the first detection signal VD1 after the time T1. Then, the input sensing voltage VINS after the time T1 follows the second detection signal VD2.

When the input detection voltage VIND reaches the reference voltage VR1 at a time T2, the voltage V1 is increased to a high level. Then, the switch 25 is turned on and the peak sensing voltage VPS starts to increase.

When the peak sensing voltage VPS reaches the reference voltage VR2 at a time T3, the peak detection signal VPD is increased to a high level. The output signal S1 is decreased to a low level at the time T3, and the output signal S2 is increased to a high level. The switch 44 is turned off from the time T3, the capacitor C4 is charged by a current of the current source 43, and the first detection signal VD1 is increased. The switch 45 is turned on from the time T3, capacitor C5 is discharged by a current of the current source 46, and the second detection signal VD2 is decreased.

When the input detection voltage VIND is decreased to be lower than the reference voltage VR1 at a time T4, the voltage V1 is decreased to a low level. The voltage V2 is increased to a high level at the time T4, and the peak sensing voltage VPS is reset to the ground level when the switch 24 is turned on and the capacitor C2 is discharged.

The first detection signal VD1 crosses the second detection signal VD2 at a time T5, and the first detection signal VD1 is higher than the second detection signal VD2 after the time T5. Then, the input sensing voltage VINS after the time T5 follows the second detection signal VD2.

When the input detection voltage VIND reaches the reference voltage VR1 at a time T6, the voltage V1 is increased to a high level. Then, the switch 25 is turned on and the peak sensing voltage VPS starts to increase.

When the peak sensing voltage VPS reaches the reference voltage VR2 at a time T7, the peak detection signal VPD is increased to a high level. The output signal S1 is increased to a high level at the time T7, and the output signal S2 is decreased to a low level. The switch 44 is turned on from the time T7, the capacitor C4 is discharged by the current of the current source 42, and the first detection signal VD1 is decreased. The switch 45 is turned off from the time T7, the capacitor C5 is charged by the current of the current source 47, and the second detection signal VD2 is increased.

When the input detection voltage VIND is decreased to be lower than the reference voltage VR1 at a time T8, the voltage V1 is decreased to a low level. The voltage V2 is increased to a high level at the time T8, and the peak sensing voltage VPS is reset to the ground level when the switch 24 is turned on and the capacitor C2 is discharged.

After a time T9, the operations during the period T1 to T8 are repeated. A dotted line such as the input sensing voltage VINS illustrated in FIG. 5 is assumed as an ideal line input voltage Vin in which distortion does not occur. Times at which the input sensing voltage VINS has the lowest voltage like the times T1, T5, and T9 correspond to the zero-crossing times of the line input voltage Vin illustrated by the dotted line, and peak times of the input sensing voltage VINS like the times T3 and T7 correspond to the peak times of the line input voltage Vin illustrated by the dotted line.

Hereinafter, another embodiment of the present invention will be described with reference to FIGS. 6 to 8.

Figure 6:
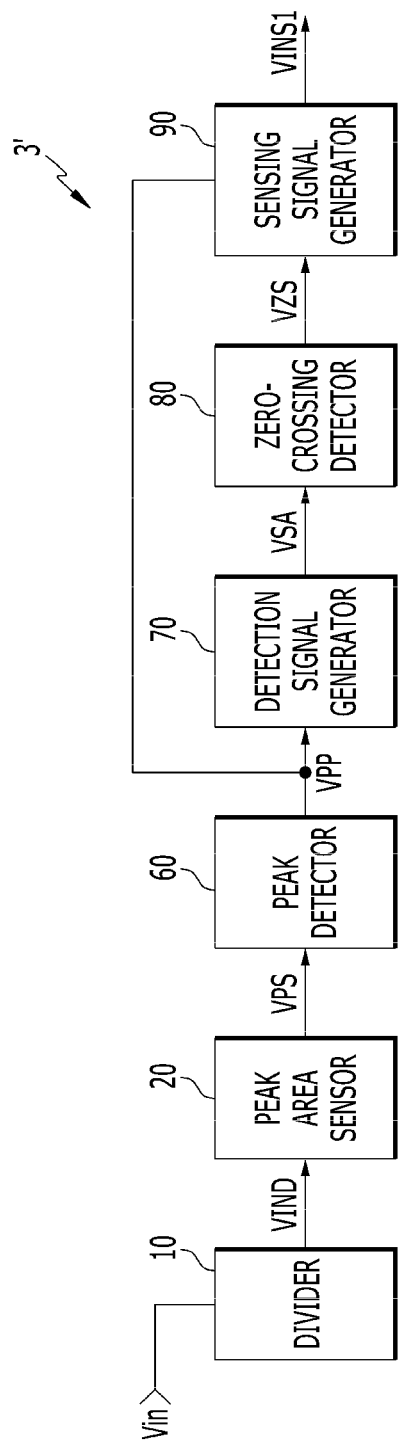
FIG. 6 is a diagram illustrating an input voltage detection circuit according to another embodiment of the present invention.

FIG. 6 is a diagram illustrating an input voltage detection circuit according to another embodiment.

An input voltage detection circuit 3' includes a divider 10, a peak area sensor 20, a peak detector 60, a detection signal generator 70, a zero-crossing detector 80, and a sensing signal generator 90. Components of the divider 10 and the peak area sensor 20, which have the same configuration as that in the above-described embodiment, are denoted by the same reference numerals, and description thereof will be omitted.

The peak detector 60 sets a reference voltage VR3 using a peak sensing voltage VPS, and generates a peak detection signal VPP corresponding to a peak of a line input voltage Vin based on a result of comparing the peak sensing voltage VPS and the reference voltage VR3. There may be a difference in that the peak detection signal VPP is a pulse compared to the peak detection signal VPD of the peak detector 30.

The detection signal generator 70 generates a sawtooth wave VSA, which is increased during one cycle of the peak detection signal VPP by being synchronized with the peak detection signal VPP.

The zero-crossing detector 80 generates a zero-crossing detection signal VZS which indicates a zero-crossing time by detecting a center of the sawtooth wave VSA. The zero-crossing detector 80 generates a reference voltage VR4 corresponding to the center of the sawtooth wave VSA, and generates the zero-crossing detection signal VZS based on a result of comparing the sawtooth wave VSA and the reference voltage VR4.

The sensing signal generator 90 generates an input sensing voltage VINS1 which is decreased by being synchronized with the peak detection signal VPP and increased by being synchronized with the zero-crossing detection signal VZS.

Hereinafter, a configuration of the input voltage detection circuit according to another embodiment will be described with reference to FIG. 7.

Figure 7:
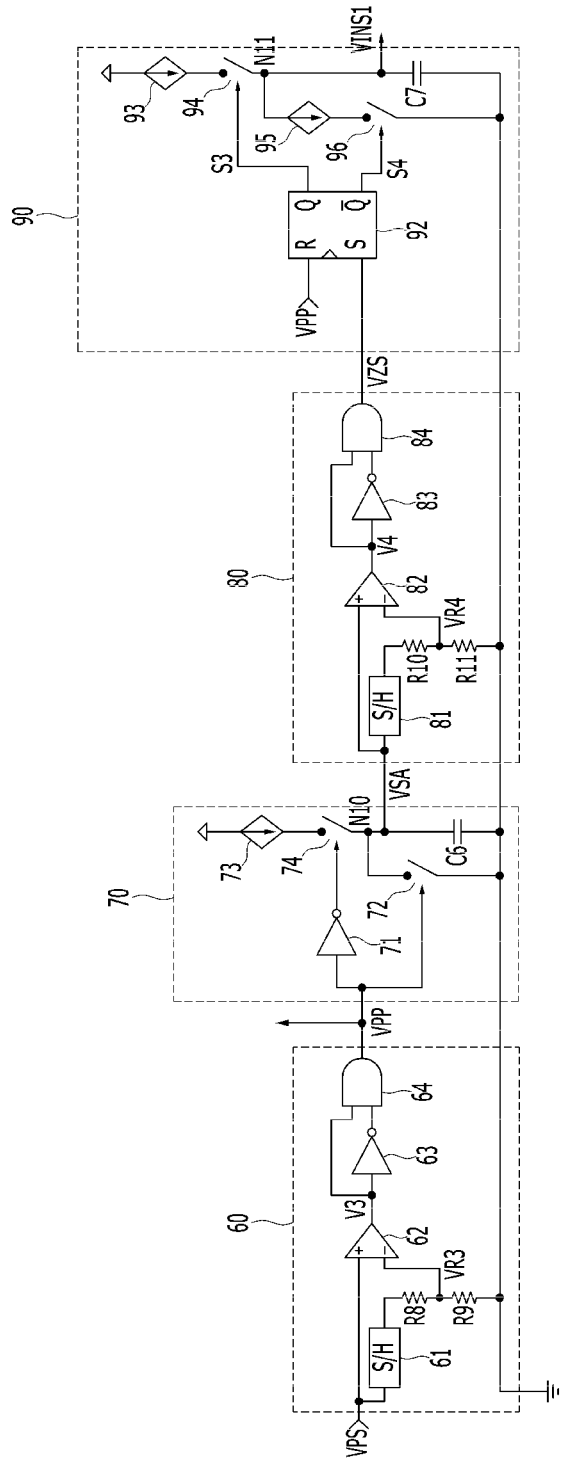
FIG. 7 is a diagram illustrating a configuration of a peak detector, a detection signal generator, a zero-crossing detector, and a sensing signal generator according to another embodiment.

FIG. 7 is a diagram illustrating a configuration of the peak detector, the detection signal generator, the zero-crossing detector, and the sensing signal generator according to another embodiment.

The peak detector 60 includes a sample-and-hold unit 61, a comparator 62, an inverter 63, a logic gate 64, and two resistors R8 and R9.

The sample-and-hold unit 61 samples and holds a peak of the peak sensing voltage VPS. As the held voltage is divided by the resistor R8 and the resistor R9, the reference voltage VR3 is generated. For example, the resistor R8 and the resistor R9 are connected in series between an output of the sample-and-hold unit 61 and a ground, and the reference voltage VR3 is half of the peak of the peak sensing voltage VPS when the two resistors R8 and R9 are the same.

The comparator 62 outputs a voltage V3 based on a result of comparing the peak sensing voltage VPS and the reference voltage VR3. For example, the peak sensing voltage VPS is input to a non-inverting terminal (+) of the comparator 62 and the reference voltage VR3 is input to an inverting terminal (−) of the comparator 62. When an input of the non-inverting terminal (+) is greater than or equal to an input of the inverting terminal, the comparator 62 outputs the voltage V3 having a high level, and otherwise the comparator 62 outputs the voltage V3 having a low level.

The inverter 63 inverts and outputs the voltage V3. The logical operation unit 64 generates the peak detection signal VPP by calculating a logical conjunction of the voltage V3 and an output of the inverter 63. The output of the inverter 63 may have a predetermined delay with respect to the increasing and decreasing of the voltage V3. For example, when the voltage V3 is increased to a high level, it takes a predetermined period to decrease the output of the inverter 63 to a low level. That is, a period in which both of the voltage V3 and the output of the inverter 63 have a high level may occur, and an output of the logic gate 64 may have a high level during this period.

The detection signal generator 70 includes an inverter 71, two switches 72 and 74, a current source 73, and a capacitor C6.

The inverter 71 inverts and outputs the peak detection signal VPP.

The capacitor C6 is connected between a node N10 and the ground. The current source 73 is connected to the node N10 through the switch 74 and may charge the capacitor C6. The switch 74 is connected between the current source 73 and the node N10, and the switch 72 is connected between the node N10 and the ground.

The switch 74 switches according to an output of the inverter 71 and the switch 72 switches according to the peak detection signal VPP. For example, the switch 74 is turned on by a high level output of the inverter 71 and is turned off by a low level output of the inverter 71. The switch 72 is turned on by the peak detection signal VPP having a high level and is turned off by the peak detection signal VPP having a low level.

The sawtooth wave VSA, which is a voltage of the node N10, is increased by a current of the current source 73 during a low level period of the peak detection signal VPP and is reset to a ground level by the peak detection signal VPP having a high level.

The zero-crossing detector 80 includes a sample-and-hold unit 81, a comparator 82, an inverter 83, a logic gate 84, and two resistors R10 and R11.

The sample-and-hold unit 81 samples and holds a peak of the sawtooth wave VSA. As the held voltage is divided by the resistor R10 and the resistor R11, the reference voltage VR4 is generated. For example, the resistor R10 and the resistor R11 are connected in series between an output of the sample-and-hold unit 81 and the ground, and the reference voltage VR4 is half of the peak of the sawtooth wave VSA when the two resistors R10 and R11 are the same.

The comparator 82 outputs a voltage V4 based on a result of comparing the sawtooth wave VSA and the reference voltage VR4. For example, the sawtooth wave VSA is input to a non-inverting terminal (+) of the comparator 82 and the reference voltage VR4 is input to an inverting terminal (−) of the comparator 82. When an input of the non-inverting terminal (+) is greater than or equal to an input of the inverting terminal (−), the comparator 82 outputs the voltage V4 having a high level, and otherwise the comparator 82 outputs the voltage V4 having a low level.

The inverter 83 inverts and outputs the voltage V4. The logical operation unit 84 generates the zero-crossing detection signal VZS by calculating a logical conjunction of the voltage V4 and an output of the inverter 83. The output of the inverter 83 may have a predetermined delay with respect to the increasing and decreasing of the voltage V4. For example, when the voltage V4 is increased to a high level, it takes a predetermined period to decrease the output of the inverter 83 to a low level. That is, a period in which both of the voltage V4 and the output of the inverter 83 have a high level may occur, and an output of the logic gate 84 may have a high level during this period.

The sensing signal generator 90 includes an SR flip-flop 92, two current sources 93 and 95, two switches 94 and 96, and a capacitor C7.

The SR flip-flop 92 includes a set terminal S to which the zero-crossing detection signal VZS is input and a reset terminal R to which the peak detection signal VPP is input, generates output signals S3 and S4 according to inputs of the set terminal S and the reset terminal R, and outputs the output signal S3 and the output signal S4 through an output terminal Q and an inverted output terminal $\overline{Q}$, respectively. For example, the SR flip-flop 92 enables the output signal S3 and disables the output signal S4 by being synchronized with a rising edge of the set terminal S. The SR flip-flop 92 enables the output signal S4 and disables the output signal S3 by being synchronized with a rising edge of the reset terminal R.

The capacitor C7 may be connected between a node N11 and the ground, and the current source 93 may be connected to the node N11 through the switch 94 and may supply a current to the capacitor C7. The switch 94 is connected between the current source 93 and the node N11. When the switch 94 is turned on, the capacitor C7 is charged by a current of the current source 93, and thus the input sensing voltage VINS1 is increased.

The current source 95 is connected to the node N11, and may sink a current to the ground through the switch 96. When the switch 94 is turned on, the capacitor C7 is discharged by a current of the current source 95. The current of the current source 95 may be the same as the current of the current source 93.

Figure 8:
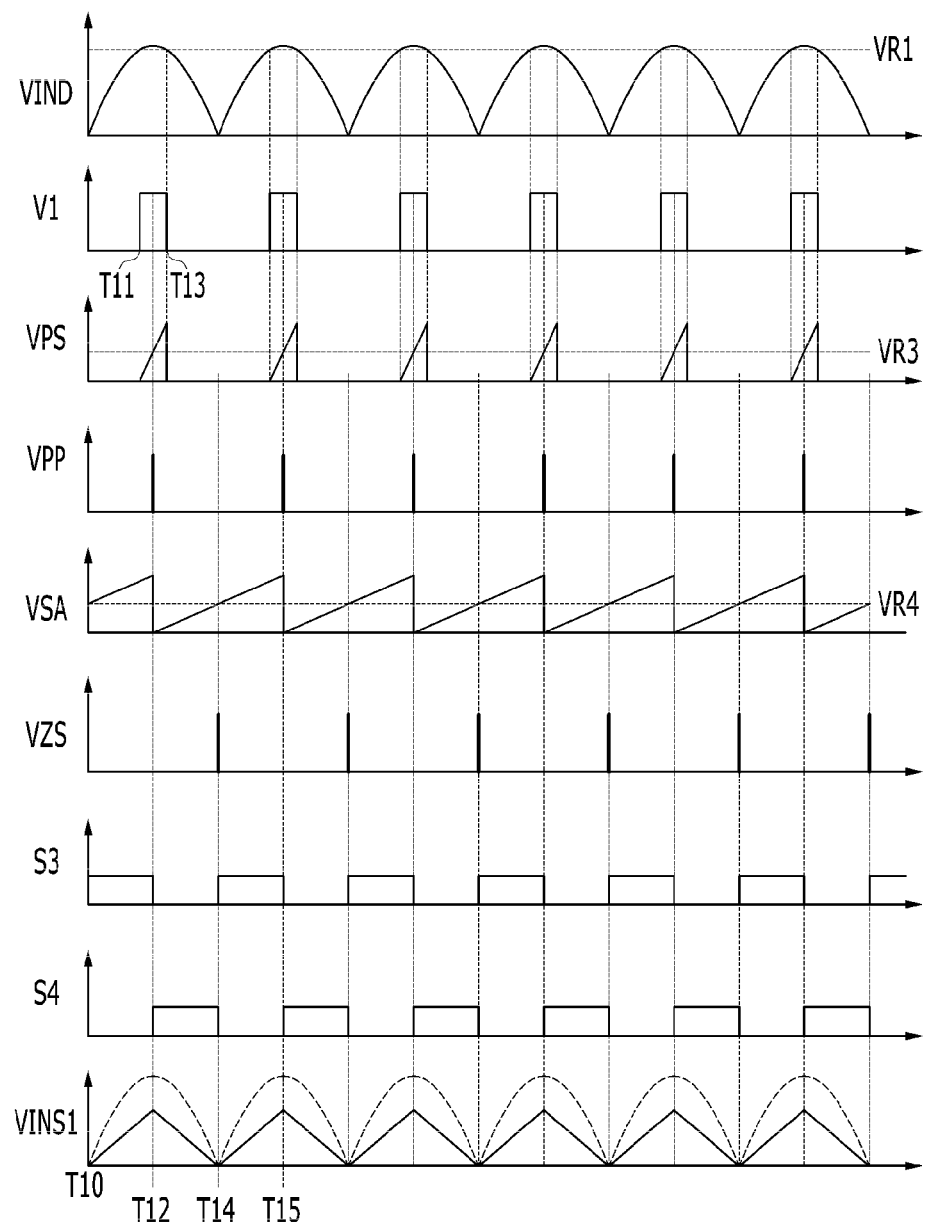
FIG. 8 is a waveform diagram for describing an operation of the input voltage detection circuit according to another embodiment.

FIG. 8 is a waveform diagram for describing an operation of the input voltage detection circuit according to another embodiment.

The input detection voltage VIND starts to increase from zero voltage at a time T10. The sawtooth wave VSA reaches the reference voltage VR4 at the time T10, and thus the zero-crossing detection signal VZS may result in a high level pulse. Specifically, an output of the comparator 82 becomes high level at the time T10, and a high level pulse width of the zero-crossing detection signal VZS is determined according to a transmission delay caused by the inverter 83.

At the time T10, the output signal S3 is increased to a high level according to the high level pulse of the zero-crossing detection signal VZS, and the output signal S4 is decreased to a low level. Then, from the time T10, the switch 94 is turned on, the switch 96 is turned off, the capacitor C7 is charged by a current of the current source 93, and thus an input sensing voltage VINS1 is increased.

When the input detection voltage VIND reaches the reference voltage VR1 at a time T11, the voltage V1 is increased to a high level. Then, the switch 25 is turned on, and thus the peak sensing voltage VPS starts to increase.

When the peak sensing voltage VPS reaches the reference voltage VR3 at a time T12, the peak detection signal VPP may result in a high level pulse. Specifically, an output of the comparator 62 becomes high level at the time T12, and a high level pulse width of the peak detection signal VPP is determined according to a transmission delay caused by the inverter 63.

The output signal S3 is decreased to a low level at the time T12 according to the high level pulse of the peak detection signal VPP, and the output signal S4 is increased to a high level. Then, from the time T12, the switch 94 is turned off, the switch 96 is turned on, the capacitor C7 is discharged by a current of the current source 95, and thus the input sensing voltage VINS1 is decreased.

Also, the sawtooth wave VSA is reset to the ground level by the peak detection signal VPP at the time T12.

When the input detection voltage VIND is decreased to be lower than the reference voltage VR1 at a time T13, the voltage V1 is decreased to a low level. When a voltage V2 is increased to a high level at a time T13 and the switch 24 is turned on, the capacitor C2 is discharged, the peak sensing voltage VPS is reset to the ground level.

The input detection voltage VIND starts to increase from zero voltage at the time T14. After the time T14, the operations during the period T10 to T14 are repeated. As illustrated in FIG. 8, times at which the input sensing voltage VINS1 has the lowest voltage like the times T10 and T14 correspond to the zero-crossing times of the line input voltage Vin illustrated by the dotted lines, and peak times of the input sensing voltage VINS1 like the times T12 and T15 correspond to the peak times of the line input voltage Vin illustrated by the dotted lines.

Thus, in the embodiments, the zero-crossing times of the line input voltage Vin may be accurately detected without being influenced by distortion of the line input voltage Vin.

While embodiments have been described above in detail, the scope of embodiments of the present invention is not limited thereto, but encompasses several modifications and improvements by those skilled in the art using basic concepts of embodiments of the present invention defined by the appended claims.

The invention claimed is:

1. An input voltage detection circuit comprising:
a peak area sensor configured to generate a peak sensing voltage that indicates an interval corresponding to a peak area around a peak of a line input voltage; and
a peak detector configured to determine, using the peak sensing voltage, a time corresponding to a center of the interval indicated by the peak sensing voltage and to generate a peak detection signal that indicates the peak of the line input voltage based on the time corresponding to the center of the interval indicated by the peak sensing voltage;
a detection signal generator configured to generate a first detection signal that varies by being synchronized with the peak detection signal and a second detection signal that has a phase difference corresponding to one cycle of the peak detection signal and that varies by being synchronized with the peak detection signal; and
a synthesizer configured to synthesize the first and second detection signals and generate the input sensing voltage on an output node, the synthesizer comprising:
a first diode including an anode to which the first detection signal is input and a cathode connected to the output node; and
a second diode including an anode to which the second detection signal is input and a cathode connected to the output node,
wherein the input voltage detection circuit is configured to generate an input sensing voltage corresponding to the line input voltage and having a peak that is synchronized with the peak detection signal.

2. The circuit of claim 1, wherein the detection signal generator comprises a T flip-flop configured to invert a first output signal by being synchronized with the peak detection signal and invert a second output signal having an inverted phase with respect to a phase of the first output signal by being synchronized with the peak detection signal,
wherein the detection signal generator is configured to generate a first detection signal which is increased or decreased according to the first output signal and a second detection signal which is increased or decreased according to the second output signal.

3. The circuit of claim 2, wherein the detection signal generator further comprises:
a capacitor connected between a first node and a ground;
a first current source connected to the first node and configured to supply a current to the capacitor;
a second current source connected to the first node; and
a switch connected between the second current source and the ground,
wherein a current generated by the second current source is twice a current generated by the first current source.

4. The circuit of claim 3, wherein the switch switches according to the first output signal, and a voltage of the first node is the first detection signal.

5. The circuit of claim 3, wherein the switch switches according to the second output signal, and a voltage of the first node is the second detection signal.

6. The circuit of claim 1, wherein the peak detector is configured to set a second reference voltage corresponding to the center of the peak sensing voltage and generate the peak detection signal based on a result of comparing the peak sensing voltage and the second reference voltage.

7. The circuit of claim 6, wherein the peak detector comprises:

a diode including an anode to which the peak sensing voltage is applied and a cathode connected to a first node;
a capacitor connected between the first node and a ground;
a first resistor and a second resistor connected in series between the first node and the ground; and
a comparator configured to compare the peak sensing voltage and a node voltage between the first and second resistors and generate the peak detection signal,
wherein the node voltage between the first resistor and the second resistor is the second reference voltage.

8. The circuit of claim 6, wherein the peak detector comprises:
a sample-and-hold unit configured to sample and hold a peak of the peak sensing voltage;
a first resistor and a second resistor connected in series between an output of the sampling-and-holding unit and a ground;
a comparator configured to compare the peak sensing voltage and a node voltage between the first resistor and the second resistor;
an inverter configured to invert an output of the comparator; and
a logic gate configured to calculate a logical conjunction of the output of the comparator and an output of the inverter and generate the peak detection signal,
wherein the node voltage between the first and second resistors is the second reference voltage.

9. The circuit of claim 1, wherein the input voltage detection circuit is configured to detect a zero-crossing time based on two adjacent peaks of the line input voltage.

10. An input voltage detection circuit comprising:
a peak area sensor configured to generate a peak sensing voltage that indicates an interval corresponding to a peak area around a peak of a line input voltage;
a peak detector configured to determine, using the peak sensing voltage, a time corresponding to a center of the interval indicated by the peak sensing voltage and to generate a peak detection signal that indicates the peak of the line input voltage based on the time corresponding to the center of the interval indicated by the peak sensing voltage;
a detection signal generator configured to generate a sawtooth wave that is increased during one cycle of the peak detection signal by being synchronized with the peak detection signal;
a zero-crossing detector configured to detect a center of the sawtooth wave and generate a zero-crossing detection signal that indicates a zero-crossing time; and
a sensing signal generator configured to generate an input sensing voltage that is decreased by being synchronized with the peak detection signal and is increased by being synchronized with the zero-crossing detection signal,
wherein the input voltage detection circuit is configured to generate an input sensing voltage corresponding to the line input voltage and having a peak that is synchronized with the peak detection signal.

11. The circuit of claim 10, wherein the detection signal generator comprises:
a current source configured to supply a current;
a capacitor connected between a first node and a ground;
a first switch connected between the capacitor and the current source and configured to switch according to an inverted peak detection signal; and a second switch connected between the first node and the ground and configured to switch according to the peak detection signal, wherein a voltage of the first node is the sawtooth wave.

12. The circuit of claim 10, wherein the zero-crossing detector is configured to generate a reference voltage corresponding to the center of the sawtooth wave and generate the zero-crossing detection signal based on a result of comparing the sawtooth wave and the reference voltage.

13. The circuit of claim 12, wherein the zero-crossing detector comprises:
   a sample-and-hold unit configured to sample and hold a peak of the sawtooth wave;
   two resistors connected in series between an output of the sample-and-hold unit and ground; and
   a comparator configured to compare the sawtooth wave with the reference voltage,
   wherein the zero-crossing detector is configured to generate the zero-crossing detection signal based on an output of the comparator.

14. The circuit of claim 13, wherein the zero-crossing detector further comprises:
   an inverter configured to invert and output the output of the comparator; and
   a logic gate configured to calculate a logical conjunction of the output of the comparator and an output of the inverter and generate the zero-crossing detection signal.

15. The circuit of claim 10, wherein the sensing signal generator comprises an SR flip-flop configured to enable a third output signal by being synchronized with the zero-crossing detection signal, and enable a fourth output signal by being synchronized with the peak detection signal,
   wherein the sensing signal generator is configured to generate the input sensing voltage which is increased according to the third output signal and is decreased according to the fourth output signal.

16. The circuit of claim 15, wherein the sensing signal generator comprises:
   a first current source configured to supply a first current;
   a second current source configured to sink a second current;
   a capacitor connected between an output node and a ground;
   a first switch connected between the output node and the first current source and configured to switch according to the third output signal; and
   a second switch connected between the output node and the second current source and configured to switch according to the fourth output signal.

17. The circuit of claim 10, wherein the peak detector is configured to set a second reference voltage corresponding to the center of the peak sensing voltage and generate the peak detection signal based on a result of comparing the peak sensing voltage and the second reference voltage.

18. An input voltage detection circuit comprising:
   a peak area sensor configured to generate a peak sensing voltage that indicates an interval corresponding to a peak area around a peak of a line input voltage; and
   a peak detector configured to determine, using the peak sensing voltage, a time corresponding to a center of the interval indicated by the peak sensing voltage and to generate a peak detection signal that indicates the peak of the line input voltage based on the time corresponding to the center of the interval indicated by the peak sensing voltage,
   wherein the peak area sensor is configured to generate a first reference voltage that determines a peak area based on a peak of an input detection voltage corresponding to the line input voltage, and generate the peak sensing voltage based on a result of comparing the input detection voltage and the first reference voltage, and the peak area sensor comprises:
      a sample-and-hold unit configured to sample the peak of the input detection voltage, lower and hold the sampled peak, and generate the first reference voltage;
      a comparator configured to compare the input detection voltage and the first reference voltage;
      a first switch configured to switch according to an output of the comparator;
      a capacitor connected between a first terminal of the switch and a ground;
      a current source connected to a second terminal of the switch; and
      a second switch connected to the capacitor in parallel and configured to switch according to an inverted output of the comparator,
      wherein a voltage of the capacitor is the peak sensing voltage.

19. The circuit of claim 18, wherein the peak detector is configured to set a second reference voltage corresponding to the center of the peak sensing voltage and generate the peak detection signal based on a result of comparing the peak sensing voltage and the second reference voltage.

* * * * *